United States Patent [19]

Fujii et al.

[11] 4,217,689
[45] Aug. 19, 1980

[54] PROCESS FOR PREPARING SEMICONDUCTOR DEVICES

[75] Inventors: Toshiyuki Fujii; Kiyohiko Mihara; Shigeru Hokuyo; Yoshio Ishibashi, all of Itami, Japan

[73] Assignee: Mitsubishi Denki Kabushiki Kaisha, Tokyo, Japan

[21] Appl. No.: 813,347

[22] Filed: Jul. 6, 1977

[30] Foreign Application Priority Data

| Sep. 14, 1976 [JP] | Japan | 51/110582 |
| Sep. 16, 1976 [JP] | Japan | 51/111501 |
| Nov. 16, 1976 [JP] | Japan | 51/138211 |
| Nov. 16, 1976 [JP] | Japan | 51/138212 |
| Jan. 8, 1977 [JP] | Japan | 52/000988 |

[51] Int. Cl.² .................................... H01L 21/304
[52] U.S. Cl. .................................... 29/583; 29/413; 29/527.4; 125/13 R
[58] Field of Search ............... 29/413, 583, 527.4; 225/2; 125/13 R

[56] References Cited

U.S. PATENT DOCUMENTS

| 2,365,085 | 12/1944 | Joyce | 225/2 |
| 2,607,259 | 8/1952 | Forster | 29/413 X |
| 3,230,625 | 1/1966 | Meyer | 225/2 X |
| 3,241,219 | 3/1966 | Hamm | 29/413 X |
| 3,608,186 | 9/1971 | Hutson | 29/583 |
| 3,636,397 | 1/1972 | Addamiano et al. | 29/583 X |
| 4,016,855 | 4/1977 | Mimata | 125/13 R |

OTHER PUBLICATIONS

Curran, L., *Electronics*, vol. 23, No. 24, Nov. 1970, pp. 70, 71, and 73.

*Primary Examiner*—Evan K. Lawrence
*Attorney, Agent, or Firm*—Oblon, Fisher, Spivak, McClelland & Maier

[57] ABSTRACT

A process for preparing semiconductor devices by forming an insulation coating, such as a low melting point glass, on the surface of a semiconductor substrate and then forming a shaved groove through the insulation coating to the inner part of the semiconductor substrate. The insulation coating is one that is easily subject to cracking when shaved by a high speed rotating diamond blade having substantially parallel side surfaces.

The low melting point glass and the semiconductor substrate are shaved by a diamond blade having a tapered edge which rotates in high speed, without forming a crack in the insulation coating or breaking a part of the semiconductor substrate. The semiconductor substrate is divided along the shaved groove in a dicing step to obtain separated semiconductor pellets.

14 Claims, 16 Drawing Figures

PROCESS FOR PREPARING SEMICONDUCTOR DEVICES

BACKGROUND OF THE INVENTION

1. Field of the Invention

The present invention relates to a process for preparing semiconductor devices. More particularly, it relates to an improvement for forming a shaved groove reached from a low melting point glass coated on a surface of a semiconductor substrate to the inner part of the semiconductor substrate.

2. Description of the Prior Art

In general, many semiconductor devices having the same structure have been prepared by using one semiconductor substrate. The semiconductor substrate is divided into many pellets. That is, a plurality of pellets are separately arranged in the semiconductor substrate by specific steps and a mesa groove with the passivation of an insulation coating having a thermal expansion coefficient different from that of the semiconductor substrate is formed along the boundary. The semiconductor substrate is shaved along the center of the mesa groove having the insulation coating by a diamond blade which is rotated at high speed, and it is cut or snapped along the shaved groove to divide it into pellets.

However, the diamond blade used in the shaving step has parallel surfaces at the shaving edge whereby a crack is formed in the insulating coating or a part of the semiconductor substrate is broken during the shaving operation.

SUMMARY OF THE INVENTION

It is an object of the present invention to provide a process for preparing semiconductor devices by shaving a semiconductor substrate with a passivation coating by a diamond blade without forming a crack in the insulation coating or breaking a part of the semiconductor substrate.

It is another object of the present invention to provide a process for preparing semiconductor devices without forming a zig-zag break line when dicing the semiconductor substrate along the shave groove.

The foregoing and other objects of the present invention have been attained by forming an insulation coating, such as a low melting point glass, on the surface of a semiconductor substrate and then forming a shaved groove through the insulation coating through to the inner part of the semiconductor substrate with a diamond blade having a tapered edge which rotates at a high speed. The insulation coating is one that is easily subject to cracking when shaved by a high speed rotating diamond blade having substantially parallel side surfaces.

An object of the present invention is also to provide a process for preparing semiconductor devices by shaving an insulation coating by using a diamond blade having a tapered edge to form a first shaved groove which reaches to the semiconductor substrate and then, shaving the first shaved groove of the semiconductor substrate to form a second shaved groove having a narrower width in the first shaved groove, and dividing the semiconductor substrate along the second shaved groove.

BRIEF DESCRIPTION OF THE DRAWINGS

Other objects and many of the attendant advantages of the present invention will be readily appreciated as the same becomes better understood by reference to the following detailed description when considered in connection with the accompanying drawings, in which like reference characters designate the same or similar parts through the figures thereof and wherein.

DESCRIPTION OF THE PREFERRED EMBODIMENTS

Figure 1:
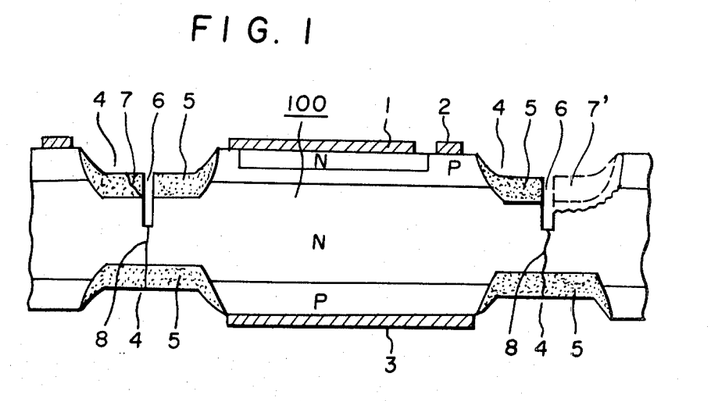
FIG. 1 is a sectional view showing grooves formed by shaving a semiconductor substrate by the conventional process.
Figure 2:
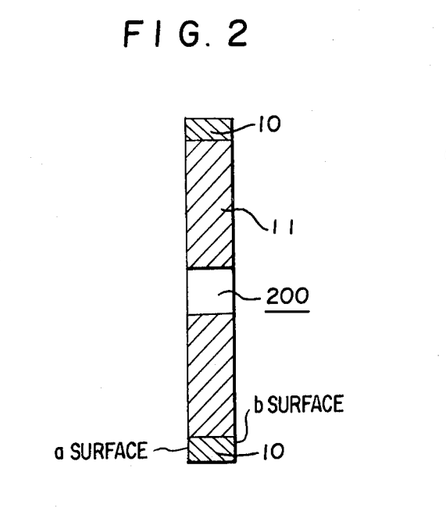
FIG. 2 is a sectional view of a straight blade used in the conventional process.

Referring to FIGS. 1 and 2, the conventional process for preparing semiconductor devices will be described prior to describing the present invention in order to provide a clear understanding of the present invention.

The middle or low power semiconductor devices having a current capacity of less than several tens of amperes are prepared by dicing a semiconductor substrate into a plurality of semiconductor pellets after a diffusing step and a metallizing step. The mesa structure is usually employed for its semiconductor devices for relatively high ability to withstand voltage.

Recently, the production of passivation mesa semiconductors having an inorganic coating such as low melting point glass coating, ($SiO_2$ coating or $Si_3N_4$ coating), instead of a resin coating such as varnish as the protective coating for the pn junction, has remarkably increased. The characteristics and reliability of the semiconductor elements have been improved and the semiconductor pellets could be prepared as a semiconductor substrate just before assembling the pellets which is remarkably advantageous in comparison with the conventional method for producing mesa semiconductors. Moreover, the package could be a resin mold type instead of the conventional can type. However, the percent of defective has been remarkably high in the step of dicing the semiconductor substrate along the mesa structure groove coated with the protective coating such as glass. This has been serious problem in mass production.

FIG. 1 is a sectional view of the semiconductor substrate processed by the conventional dicing method by a diamond blade.

In FIG. 1, the reference numeral (100) designates a semiconductor substrate on which many reverse blocking type thyristors having the same structure are formed by the specific diffusion steps; (1), (2) and (3) respectively designate ohmic electrodes which are respectively connected to outer electrodes; (4) designates a mesa groove for exposing the pn junction of the semiconductor substrate (100); (5) designates low melting glass (such as lead type or zinc type glass) which is for passivation of the pn junction exposed in the mesa groove (4); (6) designates a shaved groove shaved by the conventional diamond blade; (7) designates crack in the coated glass (5) formed by shaving; (7') designates pitting in the semiconductor substrated (100) and (8) designates the break line for dicing the semiconductor substrate produced by shaving the shaved groove (6) by a diamond blade and breaking it into pellets.

FIG. 2 is a sectional view of the conventional diamond blade used in the conventional dicing step. In FIG. 2, the reference numeral (200) designates a diamond blade; (10) designates a shaving part, and (11) designates a flange. The conventional diamond blade (200) has substantially parallel side surfaces (a and b surfaces) of at the shaving part (10) (hereinafter referring to as straight blade).

When the low melting point glass (5) and the semiconductor substrate (100) are shaved by rotating the straight blade (200) at high speed, it has been found that fine cracks (cracks 7) are formed in the glass, or the semiconductor substrate (100) is broken (chipping 7') and the glass (5) is peeled off from the semiconductor substrate (100).

It has been thought that these troubles have been caused because the thermal expansion coefficient of the low melting point glass (5) is different from that of the semiconductor substrate (100) and residual strain is created in the interface between the glass (5) and the substrate (100) by sintering the low melting point glass (5) in the mesa groove (4) at about 700° C. and cooling it; certain stress is applied to the perpendicular direction to of the blade (200) by rolling the blade or the cut powder; and because properties such as the hardness and brittleness of the glass (5) are different from those of the substrate (100).

These cracks (7) and pittings (7') decrease the withstandable voltage and reliability of the semiconductor devices. Accordingly, the productivity of the semiconductor devices formed by the conventional dicing method has been remarkably low.

The present invention provides an improved process for preparing semiconductor devices without the above-mentioned disadvantages.

Figure 3:
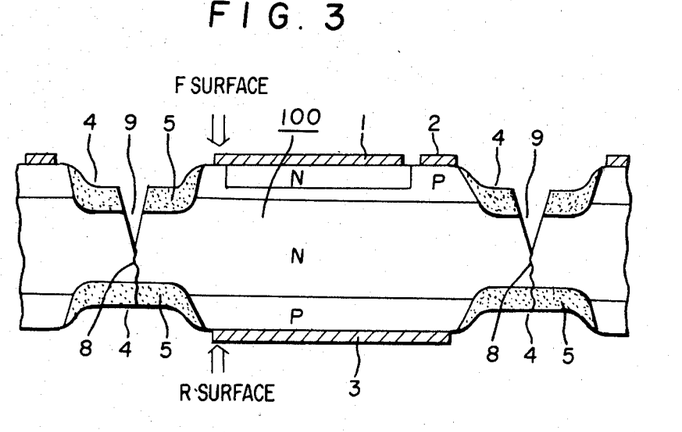
FIG. 3 is a sectional view showing grooves formed by shaving the semiconductor substrate by the process of the present invention.

FIG. 3 is a sectional view for illustrating one embodiment of the process for preparing semiconductor devices according to the present invention. In FIG. 3, the reference numeral (100) designates a semiconductor substrate which is processed by the conventional diffusing step and forming many thyristor elements having the same structure with each space; (1), (2) and (3) are respectively a cathode, a gate and an anode which are respectively brought into ohmic contacts with the specific surface regions. For example, they can be formed by depositing Al-Mo-Ni-Au in multi layers. The reference numeral (4) designates a mesa groove formed between the thyristor elements on the substrate by etching it with an etching solution of nitric acid and hydrofluoric acid for the specific time, so as to expose the pn junction formed in the semiconductor substrate (100). The reference numeral (5) designates a low melting point glass (such as lead type glass or zinc type glass) which is coated on the mesa groove (4) so as to protect the pn junction exposed in the mesa groove (4).

Figure 4:
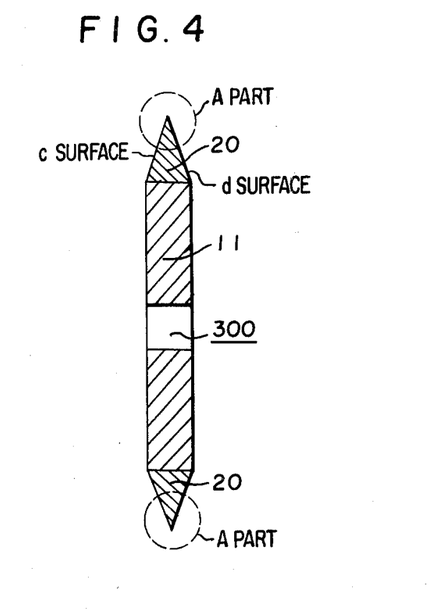
FIG. 4 is a sectional view of a diamond blade having a tapered edge.

FIG. 4 is a sectional view of one embodiment of a diamond blade having a tapered edge which is used in the present invention.

In FIG. 4, the reference numeral (300) designates a diamond blade; (11) designates a flange; (20) designates a shaving part (shaving blade).

Figure 5:
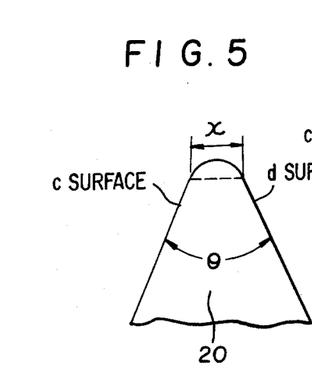
FIGS. 5 to 7 are respectively partial enlarged sectional views of shaving parts.

FIG. 5 is a partially enlarged view of the A part of the shaving part (20) in which the part for shaving is continuously thinner from the base to the edge (hereinafter referring to as a tapered blade).

In the process of the present invention, the tapered blade (300) is rotated in high speed to shave the low melting point glass (5) and the semiconductor substrate (100) so as to form the shaved groove (9) as shown in FIG. 3, and then, the semiconductor substrate (100) is divided along the break lines (8) into reverse blocking type thyristor pellets.

In the shaving part (20) shown in FIG. 5, the side surfaces c and d have an angle $\theta$. The edge of the shaving part is preferably sharp, however, in practice, the edge is usually not sharp because of the preparation technique of the blade, and the edge may be worn in the shaving operation. The width x at the edge shown in FIG. 5 was in a range of 20 to 40 $\mu$m before the shaving operation. If the edge is worn to broaden the width at the bottom of the shaved groove (9) and to form a round shape in the shaving step, the break line (8) may not be straight line but a zig-zag line (whereby the pellets may not have the predetermined shape, causing trouble in the assembling step), or the crack is formed in the coated glass (5) and a part of the pellets is broken in the step of breaking the semiconductor substrate (100).

The life of the edge of the blade varies depending upon the kinds of the workpieces. In accordance with the experiments, there is no trouble in the shaving operation in the case of the width x$\simeq$50 to 60 $\mu$m (FIG. 5), and no crack is found in the glass (5) and no pitting is found in the semiconductor substrate (100). It is thought that when the semiconductor substrate (100) with passivation of the glass (5) is shaved at the glass passivation part by a tapered blade (300), the formation of a crack in the glass (5) and the chipping of the semiconductor substrated (100) can be prevented for the following reasons.

Even though the degree of rotation of the blade is the same, the perpendicular force of the tapered blade (300) is weaker than that of the straight blade (200) and is inclined to the direction of entering of the tapered blade (300).

As it is clear from the shape of the shaved groove (9), the passivation glass (5) on the mesa groove (4) is highly durable to the forces in the direction entering the blade or in the perpendicular direction thereof.

From the viewpoint of the shaving step, the edge of the tapered blade (300) has a smaller part for contacting the workpiece to shave it at the first moment. At the time, the breaking energy applied to the workpiece is small. At the first step, the relatively thin shaved groove (9) is formed without forming crack in the glass (5). In the second step, the shaved groove (9) is deeply shaved by the edge of the blade (300) and also it is gradually broadened by shaving both side parts by both tapered side surfaces of the blade.

In the second step, the breaking energy is large. Accordingly it may be thought to cause a highly adverse effect. However, in the shaving of both side surfaces, the residual strain between the passivation glass (5) and the semiconductor substrate (100) maintained before shaving, is partially released through the thin shaved groove (9) shaved in the first step whereby the formation of crack in the glass can be prevented.

When the conventional straight blade (200) and the tapered blade (300) of the present invention were used in practical operations to measure percent of defectives, the percent of defective was 35 to 50% in the case of the straight blade and it was 0 to 8% in the case of the tapered blade. The difference was clear.

The diamond blade used in the experiment of the invention had flat surfaces of both tapered side surfaces c and d surfaces as shown in FIG. 5. However, it is possible to use the blade having both side surfaces $c_2$ and $d_2$ having convex curvature as shown in FIG. 6 or concave curvature as shown in FIG. 7.

The results of the present invention can be attained by using a tapered diamond blade (300) in which the edge of the shaving part (20) is continuously tapered. The edge of the shaving part (20) can be sharp or not sharp unless enlarging the width x of the edge is due by wearing it.

Figures 6, 7:
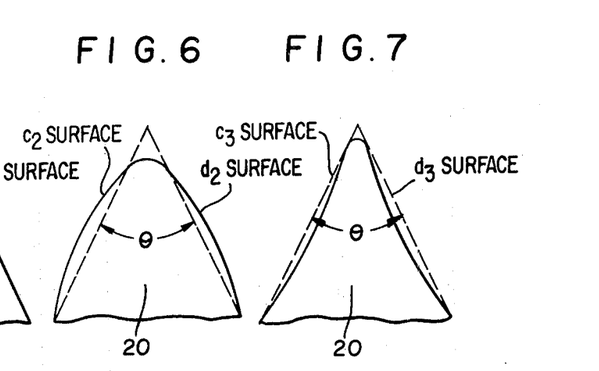

With regard to the shapes of the edges of the blades (300), the taper angle $\theta$ of the blade is defined as shown in FIGS. 5 to 7.

In FIGS. 6 and 7, the taper angle $\theta$ relates to the average angle at the edge for the shaving operation. The life of the blade varies depending upon the degree of wear at the edge of the blade. The progress of the wear is highly dependent upon the taper angle $\theta$ of the blade. This fact was found by the experiments.

Figure 8:
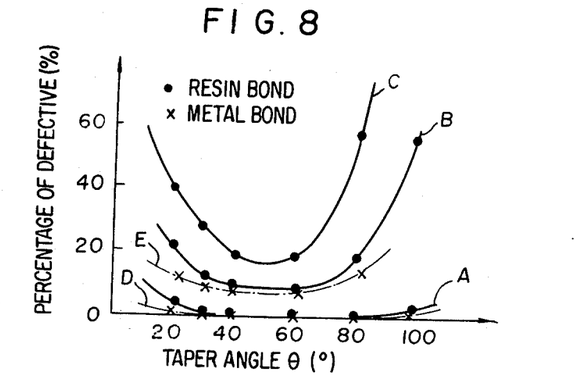
FIG. 8 is a graph showing the relation of the taper angle of the blade having the tapered edge and percentage of defective.

FIG. 8 is a graph showing the relation of the taper angle $\theta$ of the diamond blade (300) and the percent of defective elements (reverse blocking type thyristors separated by dicing) wherein the semiconductor substrate with passivation of the low melting point glass (lead type) is divided by dicing into the reverse blocking type thyristors (pellets size of 4mm×4mm) by the diamond blade (300) (resin bond or metal bond type having an average particle size of 30 $\mu$m).

In FIG. 8, the lines A, B and C respectively show the relations for the running distance of the resin bond type diamond blade (300) of 5m, 80m and 250m. The lines D and E respectively show the relations for the running distance of the metal bond type diamond blade (300) of 10m and 300m.

As it is clear from FIG. 8, the life of the metal bond type blade is longer than that of the resin bond type and the merit of the blade having smaller angle $\theta$ is higher than that of the blade having larger angle $\theta$.

The percent of defective could be minimized in the range of 20 to 80 degrees especially about 25 to 60 degrees of the taper angle $\theta$ of the blade.

The relation of the particle size of the diamond used in the diamond blade (300) and the shaving result of the glass passivation element; is as follows.

(1) When the particle size of the diamond is less than 8 $\mu$m, the shaved surface is smooth and the wearing resistance of the blade is high, but the particle spaces of the blade are lost by clogging etc. whereby it is necessary to give dressing (to expose new shaving surface by sharpening on a whetstone) many times. When the dressing is not given, glass cracking and pitting increase the percent of defective in the dicing.

(2) When the particle size of diamond is more than 35 $\mu$m, the shaving effect of the blade is high but the shaved surface is relatively rough to cause pitting and the life of the blade is so short as to be uneconomical.

In accordance with the experiments for shaving, the particle size of diamond of the diamond blade (300) is preferably in a range of 8 $\mu$m to 35 $\mu$m.

Figure 9:
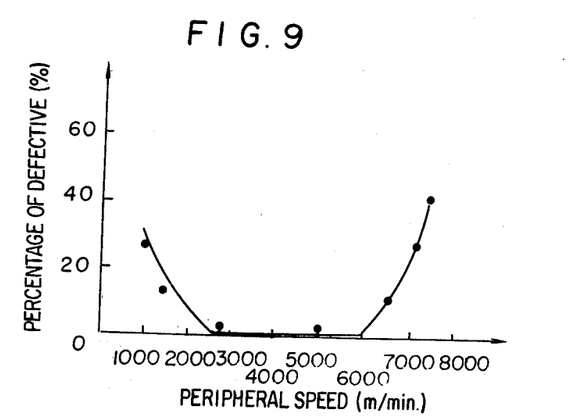
FIG. 9 is a graph showing the relation of the peripheral speed of the blade and percentage of defective.
Figure 10:
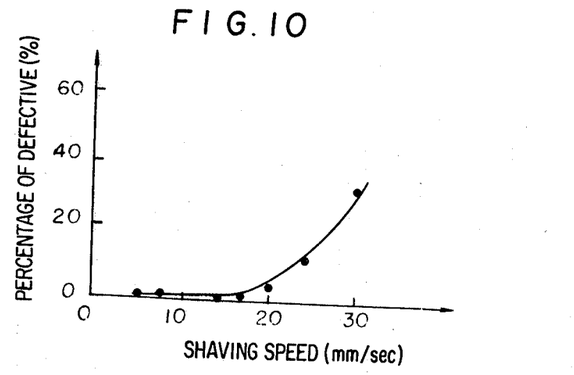
FIG. 10 is a graph showing the relation of shaving speed (feeding speed) and percentage of defective.

The percents of defective in the dicing steps using the elements of FIG. 8 were measured in the parameter of pheripheral speed and shaving speed (blade feeding speed). The results are shown in FIGS. 9 and 10. The particle size of diamond of the diamond blade is in a range of 10 $\mu$m to 20 $\mu$m, and the taper angle $\theta$ of the blade is 45 degree.

As it is clear from these results, in order to decrease the percent of defective in the dicing step, the peripheral speed of the diamond blade is in a range of 1600 m/min. to 6400 m/min, and the shaving speed is less than 24 mm/sec. In order to give low percent of defective, the peripheral speed is preferably in a range of 2500 m/min. to 5500 m/min. In order to shorten the shaving time to increase the productivety, the shaving speed is preferably in a range of 10 mm/sec. to 15 mm/sec.

In the shaving operation, the semiconductor substrate (100) is shaved to a depth of about $\frac{1}{2}$ to $\frac{2}{3}$ from the interface between the passivation glass (5) and the semiconductor substrate (100) by the tapered blade (300). The remaining semiconductor substrate (100) and the passivation glass (5) in the opposite surface (FIG. 3 R surface) can be easily divided into pellets by the following breaking step. In the breaking step, the percent of defective is almost zero when the edge of the tapered blade (300) is sharp.

When it is completely cut by the tapered blade (300), the shaved parts is too large, and this adversely affects to the characteristics of th seminconductor devices. In the opposite surface (FIG. 3 R surface), glass cracking and pitting may be easily caused. Accordingly, it is preferable to partially shave the semiconductor substrate (100) in order to attain the effect of the present invention.

Figure 11:
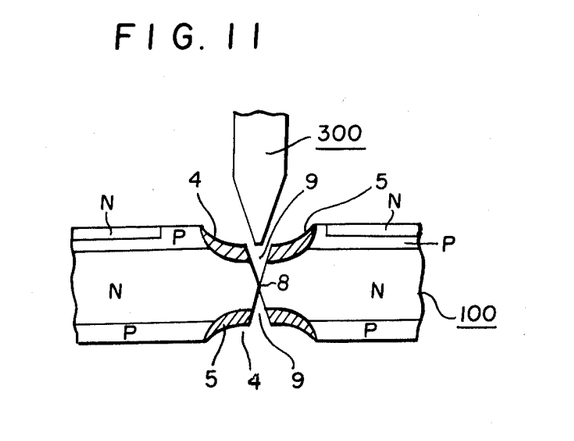
FIGS. 11 to 16 are respectively sectional views for describing the other embodiments.

FIG. 11 is a sectional view of the other embodiment for preparing the semiconductor devices according to the present invention. In the embodiment, the shaving operation is performed from both upper and lower surfaces of the semiconductor substrate (100) by using tapered diamond blades (300) and the breaking operation is performed along the break lines.

In accordance with the latter process, the formation of a crack in the glass (5) and pitting of the semiconductor substrated (100) can be prevented, and also the cut part of the pellets after the breaking step can have larger area at the center of the sectional view in parallel direction to the pellet surface. The edge of the pellet has an obtuse angle whereby the glass (5) is highly durable to shock in handling the pellets and the breaking of the glass (5) can be prevented, advantageously.

Figure 12:
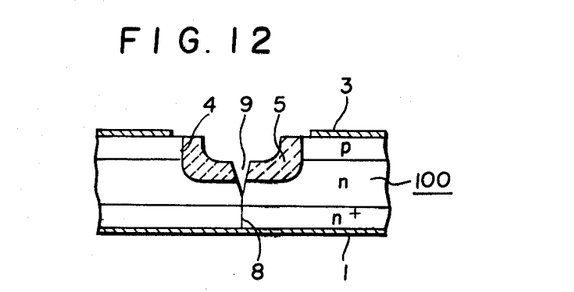

FIG. 12 is a sectional view of the embodiment for preparing mesa diodes. In FIG. 12, the reference numeral (100) designates a semiconductor substrate having p-n-n+ structure after the conventional diffusion step; (1) and (3) respectively designate a cathode and an anode which are respectively brought into ohmic contact in the specific surface regions of the semiconductor substrate (100); (4) designates a mesa groove for exposing the pn junction of the semiconductor substrate (100); (5) designates a low melting point glass coated on the mesa groove (4) for protecting the pn junction exposed in the mesa groove (4).

In the embodiment, the tapered blade (300) of FIG. 4 is rotated at high speed to shave the low melting point glass (5) and the semiconductor substrate (100) to form the shaved groove (9) and the semiconductor substrate (100) is divided along the break line (8) to obtain diode pellets. Accordingly, in the shaving step, no crack is formed in the glass (5) and no pitting is formed in the substrate (100).

Figure 13:
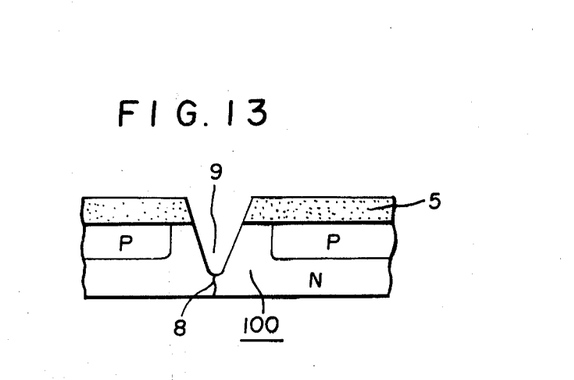
Figure 14:
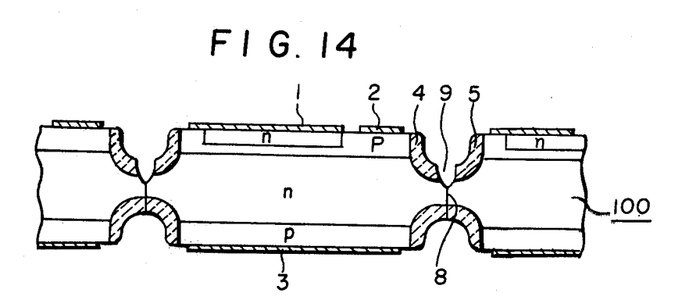

FIG. 13 is a sectional view of the embodiment for preparing planar type diodes according to the present invention. In FIG. 13, the reference numeral (100) designates a semiconductor substrate forming many diodes having the same structure which are arranged with each space, by selective diffusion of p type impurities into the n type substrate and (5) designates a low melting point glass coated in a thickness of about 30 $\mu$m on the main surface of the semiconductor substrate (100) exposing the pn junction.

In the embodiment, the low melting point glass (5) and the semiconductor substrate (100) are shaved along the boundary parts of diodes to form shaved groove (9) and the semiconductor substrate (100) is divided along the break lines to obtain diode pellets. Accordingly, in the shaving step of th embodiment, no crack is formed in the glass (5) and no pitting is formed in the substrate (100).

Figure 15:
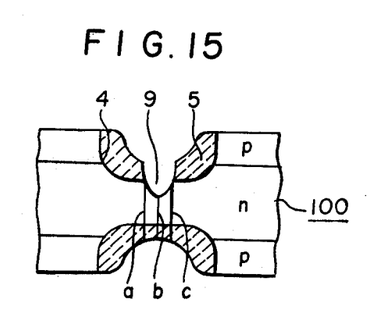

When hard low melting point glass (5) is shaved by the tapered blade (300), the wear at the edge is severe as described above whereby the shape of the bottom of the shaved groove (9) is round and broad. When the shaving operation is performed by using a blade having worn edge wear, the following phenomenon is found. In the following breaking step to cut or to snap along the shaved grooves (9), the substrate is broken at a, b and c, as shown in FIG. 15 whereby the break line (8) is not a straight line but a zig-zag line, and the shape of pellets is not a desired shape such as a square, rectangular shape. Sometimes, cracks are formed in the low melting point glass (5) and the semiconductor substrate is broken.

Thus, the disadvantages can be overcome by the following process to increase the effect of the tapered blade (300).

Figure 16:
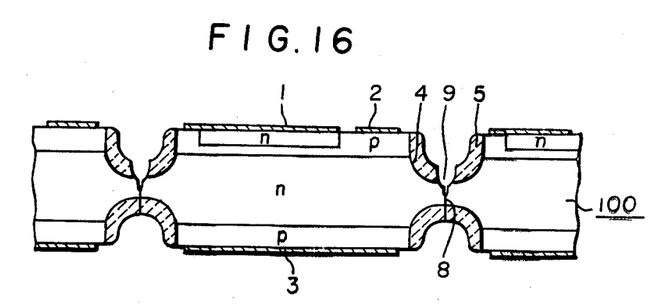

As shown in FIG. 16, the low melting point glass (5) is shaved to the depth reaching to the semiconductor substrate (100) by the tapered blade (300) having a taper angle $\theta$ of 45 degrees and then, the substrate (100) is shaved to a depth of 170 $\mu$m (a half of the substrate (100) having a thickness of 230 $\mu$m) by a straight blade (200) having a thickness of about 30 $\mu$m.

When the substrate (100) is shaved by the thin straight blade (200) at the center of the shaved groove (9), after shaving it by the tapered blade (300), the low melting point glass (5) is shaved by the tapered blade (300) whereby no crack is formed in the glass. The semiconductor substrate (100) is shaved by the thin straight blade (200) whereby the break line (8) does not cause a zig-zag line thereby to permit it to uniformly break from the bottom of the shaved groove (9) in the following break step. Accordingly, the pellets obtained by the dicing have desired precise size and no crack is formed in the glass (5) and the percent of defective can be remarkably decreased.

In the latter embodiment, a groove is shaved by the tapered blade (300) and then, the central part of the shaved groove (9) is shaved by the thin straight blade (200). The same result can be obtained by shaving the central part of the shaved groove (9) by a laser scriber instead of the straight blade (200).

When a groove is shaved only by the laser scriber, a crack is disadvantageously formed in the low melting point glass by a thermal shock when a thickness of the low melting point glass (5) is more than 20 $\mu$m.

The laser scriber cannot be used for shaving the glass having such thickness. However, in accordance with the embodiment of the present invention, it is possible to obtain pellets having precise size and no crack in the low melting point glass (5) by shaving it by the tapered blade (300) and forming narrow grooves in a half depth of the substrate (100) by the laser scriber and dividing the pellets along the shaved grooves in the break step for cutting or snapping.

In the embodiments, the low melting point glass is used as insulation coating. Thus, it is possible to use any insulation coating the present invention may effectively be applied in the case of an insulation coating having a thermal expansion coefficient different from that of the semiconductor substrate which would otherwise be cracked.

In the embodiments, the insulation coating is mainly used as a coating for protecting the exposed pn junction. Thus, it is possible to apply the insulation coating such as simple electric or thermal insulation coating, and the effect of the present invention can be attained.

In the embodiments, the preparation of reverse blocking type thyristors or diodes have been described. Thus, the present invention can be applied for the preparation of the other semiconductor devices such as two ways thyristors and transistors.

As described above, in the process for preparing the semiconductor devices of the present invention, the shaving operation is performed by using a tapered diamond blade. No crack is formed in the insulation coating and no pitting is formed in the semiconductor substrate in the shaving step, whereby semiconductor devices having high reliability can be produced with a low percent of defective.

Obviously, many modifications and variations of the present invention are possible in light of the above teachings. It is therefore to be understood that within the scope of the appended claims, the invention may be practiced otherwise than as specifically described herein.

What is claimed is:

1. A process for producing a plurality of identical semiconductor devices from a single piece of semiconductor material, having a semiconductor substrate, comprising the steps of:
   forming an insulation coating upon at least one of the upper and lower surfaces of the semiconductor substrate said coating being subject to cracking when shaved by a high speed rotating diamond blade having substantially parallel side surfaces:
   utilizing a high speed rotating diamond blade having a tapered edge constructed to eliminate cracking of the coating to form a plurality of shaved grooves through the insulation coating and into the semiconductor substrate; and
   breaking the semiconductor substrate along the shaved grooves to form a plurality of identical semiconductors;
   whereby the taper of the blade permits the coating to be shaved to define individual semiconductors without being cracked or chipped.

2. A process for preparing semiconductor devices according to claim 1 wherein the peripheral speed of the blade is in a range of 1600 m/min. to 6400 m/min.

3. A process for preparing semiconductor devices according to claim 2 wherein the feeding speed of the blade is less than 24 mm/sec.

4. A process for preparing semiconductor devices according to claim 1 wherein the blade is a diamond blade having a 20 to 80 degree taper angle at the shaving part.

5. A process for preparing semiconductor devices according to claim 1 wherein the blade is made of diamond particles having an average diameter of 8 to 36 μm.

6. A process for preparing semiconductor devices according to claim 1 wherein the blade is a metal bond type diamond blade.

7. A process for preparing semiconductor devices according to claim 6 wherein, prior to forming said insulation coating, a mesa groove is formed on at least one of said upper and lower surfaces at a boundary between semiconductor devices to be produced and then said insulation coating is formed by coating on the mesa groove.

8. A process for preparing semiconductor devices according to claim 7 wherein the insulation coating is made of a low melting point glass.

9. A process for preparing semiconductor devices according to claim 7 wherein a mesa groove is respectively formed at identical positions on both said upper and lower surfaces and only the mesa groove on one surface is shaved.

10. A process for preparing semiconductor devices according to claim 7 wherein a mesa groove is respectively formed at identical positions on both said upper and lower surfaces, and the mesa grooves on both surfaces is shaved.

11. A process for preparing semiconductor devices according to claim 1 wherein the semiconductor substrate is shaved to a depth of between $\frac{1}{2}$ to $\frac{2}{3}$ of the thickness of said substrate.

12. A process for producing a plurality of identical semiconductor devices from a single piece of semiconductor material, having a semiconductor substrate, comprising the steps of:

forming an insulation coating upon at least one of the upper and lower surfaces of the semiconductor substrate said coating being subject to cracking when shaved by a high speed rotating diamond blade having substantially parallel side surfaces;

utilizing a high speed rotating diamond blade having a tapered edge constructed to eliminate cracking of the coating to form a shaved groove through the insulation coating and into the semiconductor substrate;

forming a second narrower shaved groove into the substrate at the base of the first shaved groove; and breaking the semiconductor substrate along the second shaved groove to form a plurality of identical semiconductors;

whereby the individual semiconductors are caused to be broken to define individual semiconductors in a smooth identical manner.

13. A process for preparing semiconductor devices according to claim 12 wherein the second shaved groove is formed by using a diamond blade having parallel surfaces at the shaving edge.

14. A process for preparing semiconductor devices according to claim 12 wherein the second shaved groove is formed by a laser scriber.

* * * * *